(12) United States Patent
Bendes

(10) Patent No.: US 9,908,770 B2
(45) Date of Patent: Mar. 6, 2018

(54) MICROMECHANICAL STRUCTURE

(71) Applicant: Robert Bosch GmbH, Stuttgart (DE)

(72) Inventor: David Bendes, Budapest (HU)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/317,646

(22) PCT Filed: May 29, 2015

(86) PCT No.: PCT/EP2015/061943
§ 371 (c)(1),
(2) Date: Dec. 9, 2016

(87) PCT Pub. No.: WO2015/189046
PCT Pub. Date: Dec. 17, 2015

(65) Prior Publication Data
US 2017/0225943 A1    Aug. 10, 2017

(30) Foreign Application Priority Data

Jun. 10, 2014    (DE) .......................... 10 2014 210 988

(51) Int. Cl.
*H01L 29/84*    (2006.01)
*B81B 7/00*    (2006.01)
*B81C 1/00*    (2006.01)

(52) U.S. Cl.
CPC ........ *B81B 7/0016* (2013.01); *B81C 1/00682* (2013.01); *B81B 2203/0118* (2013.01); *B81B 2207/015* (2013.01); *B81C 2201/0171* (2013.01)

(58) Field of Classification Search
CPC .......... B81B 7/0016; B81B 2203/0118; B81B 2207/015; B81C 1/00682
See application file for complete search history.

(56) References Cited

U.S. PATENT DOCUMENTS

| | | | |
|---|---|---|---|
| 6,449,079 B1 * | 9/2002 | Herrmann .......... | G02B 26/0841 359/213.1 |
| 7,234,645 B2 * | 6/2007 | Silverbrook .............. | B41J 2/14 235/454 |
| 2005/0193827 A1 | 9/2005 | Fischer et al. | |
| 2007/0257766 A1 * | 11/2007 | Richards ................ | B82Y 10/00 337/298 |
| 2008/0009434 A1 * | 1/2008 | Reches ................... | A61L 27/38 530/300 |
| 2011/0025426 A1 | 2/2011 | Steeneken et al. | |

FOREIGN PATENT DOCUMENTS

DE    19857946 C1    1/2000

* cited by examiner

*Primary Examiner* — Yosef Gebreyesus
(74) *Attorney, Agent, or Firm* — Norton Rose Fulbright US LLP; Gerard Messina

(57) ABSTRACT

A micromechanical structure is described, including: at least one elastically deformable first area, which includes a defined piezoelectrically doped second area, at least in sections; at least one fourth area, into which the electrical charges generated in the second area may be conducted; and at least one third area connected electrically to the second and fourth area, in which an electrical current flowing through is convertible into thermal energy.

12 Claims, 6 Drawing Sheets

MICROMECHANICAL STRUCTURE

FIELD OF THE INVENTION

The present invention relates to a micromechanical structure. The present invention further relates to a method for manufacturing a micromechanical structure.

BACKGROUND INFORMATION

Nowadays, microelectromechanical systems (MEMS) are widely used in a very large number of products (for example, inertial sensors in the automotive sector). In such systems, sophisticated mechanical structures primarily manufactured from silicon are combined with high-precision electronic circuits in order to implement diverse functions in miniaturized form.

Structures exposed to moving or mechanical stresses are often used in the above-named MEMS systems. In the case of sensor applications, inferences are made concerning various measured variables (for example, acceleration, rotation rate, pressure, etc.) from a vibration, shape, position, etc. of the structures. In actuator applications, the above-named properties are used for influencing the surroundings.

In order to be able to implement the described functions, the structures must be mechanically deformable. However, the deformable structures may generally experience both intended and unintended deformations and vibrations. The intended deformations and vibrations are necessary for the function, while the unintended deformations and vibrations are generated for physical reasons.

An avoidance, reduction or cessation of the character of the intended and unintended deformations and vibrations may account for a substantial share of a development effort. In this connection, mechanical properties of the silicon must be considered, silicon being mechanically very durable while having very low inherent damping. It is therefore important that the unintended deformations or vibrations be reduced or damped, in order to preferably prevent an impairment of the provided functionality.

The above-named optimization of the deformations and vibrations may be carried out with the aid of different technical means. It is known, for example, from DE 10 2009 045 541 A1 to provide mechanical stops for this purpose. The mechanical stops are, however, only effective in certain directions and only in critical amplitudes, but they do exert a substantial influence on the system, which may impair the function.

It is further known to use media (gases, vapors, liquids, etc.) for this purpose (see, for example, Stephen Terry, "A miniature silicon accelerometer with built-in damping," Solid State Sensor and Actuator Workshop, Technical Digest, 1988, Hilton Head Island, U.S.A., pages 114-116). However, the media are also effective at still non-critical amplitudes; as a result, the selective damping of unintended vibration modes may only be implemented to a limited extent.

Furthermore, electrical and/or magnetic fields may be used for this purpose of exciting the micromechanical structures (see for example, Martin Handtmann, "Dynamische Regelung mikroelektromechanischer Systeme (MEMS) mit Hilfe kapazitiver Signalwandlung und Kraftrückkopplung (Dynamic regulation of microelectromechanical systems (MEMS) with the aid of capacitive signal conversion and force feedback), Dissertation, Technical University of Munich, 2002). The fields may control the deformations and vibrations at high precision; however, they are only functional in certain directions, extensive and fixed structures being required.

The management of the vibrations requires a dissipation of energy. In the case of stops, the energy is dissipated with the aid of a mechanical deformation; in the case of the above-named media, it is dissipated with the aid of current losses and in the case of the above-named fields, it is dissipated with the aid of counter-fields.

One form of energy dissipation is also proposed in the so-called "energy harvester" (see, for example, W. J. Choi, Y. Jeon, J.-H. Jeon, R. Sood, S. G. Kim, "Energy harvesting MEMS device based on thin film piezoelectric cantilevers," Journal of Electroceramics, 2006, pages 543-548). In the devices proposed there, electrical energy is generated from selectively generated vibrations.

Without the above-named methods, errors may occur in the system, if, for example, overload, fatigue, non-linearity, irreversible displacement of the structures, etc. implement undesirable effects.

SUMMARY

It is therefore an object of the present invention to provide an improved device for the defined damping of micromechanical structures.

According to a first aspect, the objective is achieved using a micromechanical structure including:
- at least one elastically deformable first area, which includes a defined piezoelectrically doped second area, at least in sections;
- at least one fourth area, into which the electrical charges generated in the second area may be conducted; and
- at least one third area connected electrically to the second and fourth area, in which an electrical current flowing through is convertible into thermal energy.

With the aid of the micromechanical structure according to the present invention, it is advantageously possible to decouple energy from parasitic vibrations of the micromechanical structure. Electrical energy is generated from vibration energy of the vibrating element, which is subtracted from the mechanical energy and converted into thermal energy, making it possible to render the mechanical energy harmless more rapidly. As a result, it is possible in this way to damp mechanical movement. The above-named effects may be carried out in selected areas of the mechanical structure with the aid of selective dopings.

According to a second aspect, the objective is achieved using a method for manufacturing a micromechanical structure, including the steps:
a) forming at least one first elastically deformable area;
b) piezoelectric doping of the first area, at least in sections, in a second area;
c) conductive doping of at least one third area;
d) forming a fourth area, into which the electrical charges, which may be generated in the second area, may be conducted; and
e) electrical connection of the second, third and fourth area.

Preferred specific embodiments of the micromechanical structure or of the method are the subject matter of the subclaims.

One specific embodiment of the micromechanical structure is characterized in that the third area is conductively doped using a defined ohmic resistance value. In this way, it is possible to implement a structure, in which the electrical current flowing through is convertible into thermal energy.

Another specific embodiment of the micromechanical structure is characterized in that the fourth area has a defined capacitance. In this way, a current flow may materialize between a second area acting as a source, in which electrical charges are generated, to a fourth area acting as a drain, into which the electrical charges flow from the source, as a result of which the energy of the electrical charges is convertible into thermal energy in the ohmically doped third area. In this way, electrical charges may be generated in both the second and in the fourth area, resulting in an alternating current flow through the third area and consequently an improved damping effect is supported. One specific embodiment of the micromechanical structure is characterized in that the second area and the fourth area are piezoelectrically doped and are at least partially situated in the elastically deformable first area. In this way, an increased electrical voltage, and resulting from it, an increased alternating current flow through the third area, and consequently an improved damping effect are supported.

Another preferred specific embodiment of the micromechanical structure is characterized in that the second area and the fourth area are piezoelectrically doped and are at least partially situated in different deformable first areas. In this way, a design flexibility is supported for the micromechanical structure.

One advantageous refinement of the micromechanical structure provides that the second and fourth areas are piezoelectrically doped and positioned in such a way that the electrical charges generated by mechanical stresses in the second and fourth area have opposite signs. In this way, a good current flow through the third area and consequently a good damping effect of the structure are supported. Moreover, this makes it possible to implement a variety of combinations of areas. For example, this makes a spatially designed resistor connecting the second piezoelectrically doped areas possible.

One advantageous refinement of the structure provides that the second, third and fourth areas are designed to be at least partially overlapping. In this way, a conduction structure is implemented, which makes an electrical current flow possible between the charge source and the charge drain.

One specific embodiment of the structure is characterized in that electrical connections of the areas include conductively doped strip conductor structures. In this way, the electrical energy may be conducted away in a defined manner from the area of generation across the ohmically doped area to the area of the charge drain.

Another specific embodiment of the structure is characterized in that the third area is designed to be spatially allocated. In this way, a specific design of the resistance area is implemented, which supports a space-saving conversion of electrical energy into thermal energy.

Another specific embodiment of the micromechanical structure is characterized in that the resistance value of the third area is a function of at least one of the following variables: temperature, vibration amplitude, vibration phase, vibration rate, size of electromagnetic fields, external control signal. This advantageously makes it possible to implement a functionality of the ohmically doped second area as a function of different parameters. In this way, a design variety of the micromechanical structure is advantageously supported.

Another specific embodiment of the micromechanical structure provides that the conduction structures connecting the third area to other areas are designed in such a way that their electrical conductivity is a function of at least one of the following variables: temperature, vibration amplitude, vibration phase, vibration rate, size of electromagnetic fields, external control signal. A dimensioning of the energy conversion is also advantageously supported in this way.

Another specific embodiment of the micromechanical structure provides that a control device electrically connected to the third area is provided, the switching threshold of which is a function of at least one of the following variables: temperature, vibration amplitude, vibration phase, vibration rate, size of electromagnetic fields, external control signal. In this way, a dimensioning of the damping of the mechanical vibration energy of the vibration-capable first area is advantageously supported.

The present invention is described in detail below including additional advantages and features based on multiple drawings. Here, all features constitute the object of the present invention irrespective of their presentation in the description and in the drawings or irrespective of their back-reference in the patent claims. Identical or functionally identical elements are provided with identical reference numerals. The drawings are in particular intended for a basic understanding of the present invention and are not necessarily shown true to scale.

DETAILED DESCRIPTION

A basic idea of the present invention is that defined areas of silicon base material of a micromechanical structure are selectively doped with foreign material during a manufacturing process, so that piezoelectric properties are implemented in the above-named areas. With the aid of piezoelectric energy conversion, it is possible to convert the mechanical stresses stored in deformed or vibrating areas of the micromechanical structure into electrical charges.

The generated electrical charges initially remain at the site of their origin and they do not represent a damping for the vibration as long as they are not conducted away. If the deformed or vibrating structures return into the base position, the charges also disappear together with the mechanical stresses. If the electrical charges are conducted away from the site of their generation, a defined energy dissipation or conversion of mechanical vibration energy into electrical energy may be implemented.

The generated electrical charges may basically be conducted away with the aid of conductors selectively doped into the base material. The conductors may connect the various mechanically stressed locations to one another electrically, so that a charge exchange takes place. Depending on the direction (pressure or tension) and type of doping (positive or negative), the mechanical stress may generate opposite charges. The exchange of these charges changes the properties of the originally undoped structures and consequently makes it possible to optimize them with respect to their mechanical damping or vibration properties. As a result, it is in this way possible to achieve an optimization of the entire structure with respect to damping.

Figure 1:
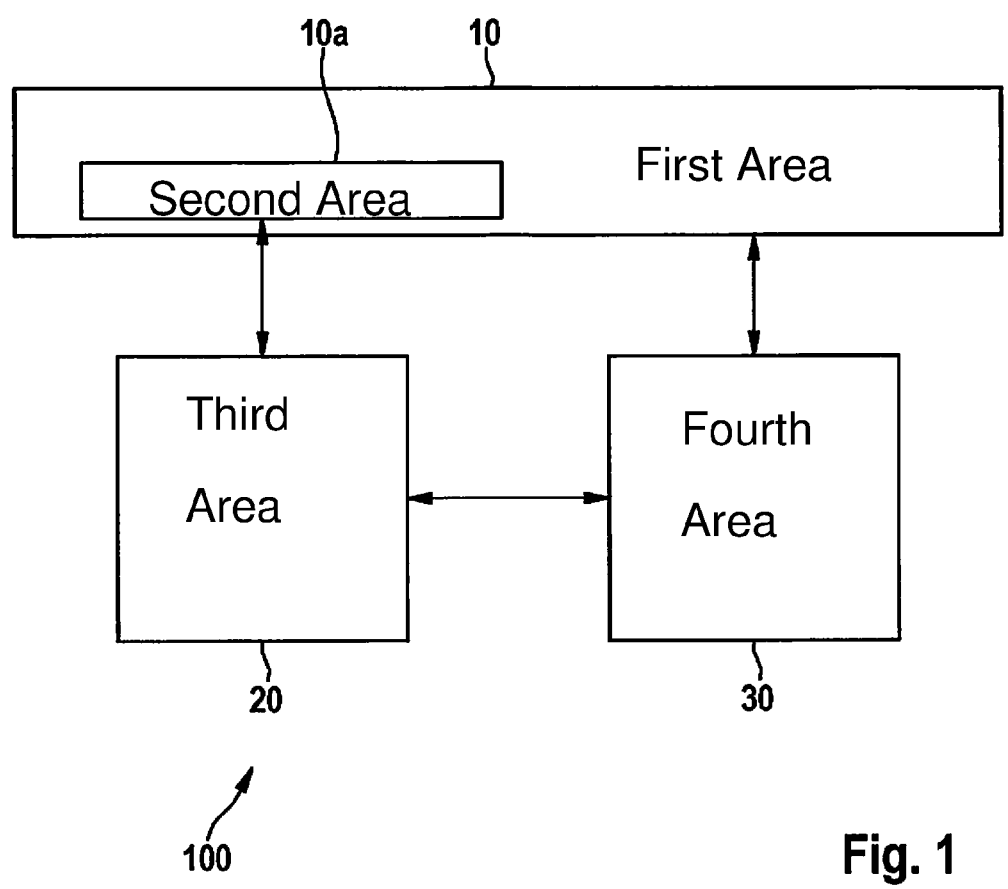
FIG. 1 shows a schematic representation of a mode of operation of the micromechanical structure.

FIG. 1 shows a schematic view of a functional principle of micromechanical structure 100 according to the present invention, which is capable of piezoelectric damping. Apparent is a first elastically deformable first area 10 (e.g., a spring), the first area including a second area 10a which is piezoelectrically doped. First area 10 including second area 10a interacts functionally with a third area 20, which is designed as an ohmically doped area, and in this way implements a functionality of an ohmic resistor. A fourth area 30 represents a charge drain, to which the electrical charges generated in second area 10a are discharged.

Fourth area 30 may preferably have a defined capacitance and in this way functionally implements a capacitor. Alternatively, fourth area 30 may also be designed as a ground terminal. Due to the electrical charges flowing from the charge source of second area 10a to the charge drain of fourth area 30, a current flows through third area 20, as a result of which the electrical current within third area 20 is converted into thermal energy and this causes the kinetic vibration energy of elastically deformable first area 10 to be reduced or damped. As a result, a piezoelectrically damped micromechanical structure 100 is provided.

Although mechanical structure 100 shown in FIG. 1 has only one first area 10, one second area 10a, one third area 20 and one fourth area 30, it is, of course, conceivable that structure 100 may also include multiple instances of above-named areas 10, 10a, 20, 30.

In principle, it is provided that second area 10a is piezoelectrically doped and is at least partially spatially situated on or in deformable first area 10. Furthermore, the basic structure is characterized in that third area 20 is doped conductively using a defined ohmic resistance value. In this way, a resistor is formed in which the generated electrical charge energy may be converted into thermal energy in a defined manner. Furthermore, basic structure 100 is characterized in that third area 20 is electrically connected to second and fourth areas 10a, 30, which represent a charge source and a charge drain.

In principle, the system according to the present invention thus represents a type of oscillating electrical circuit, in which electrical charge carriers are generated, in which an electrical current is generated from free charge carriers, the electrical current being converted into thermal energy in a defined manner in a resistor element.

In principle, multiple instances of the possibilities explained below are available for managing the electrical charges.

Passive Damping

If the areas of the micromechanical structure exposed to tensile and pressure loads include piezoelectric properties, this type of load results in electrical charges. If two locations charged with opposite polarity are connected by a resistor, an electrical current flow is created, which is converted into thermal energy in the resistor. "Opposite polarity" should be understood here to be different second areas 10a, in which, in the case of a mechanical stress on areas 10a, free charge carriers in the form of electrons or holes are generated. The electrical current consequently diverts mechanical energy from the oscillator structure, in order to damp the undesirable vibrations in this way.

Figure 2:
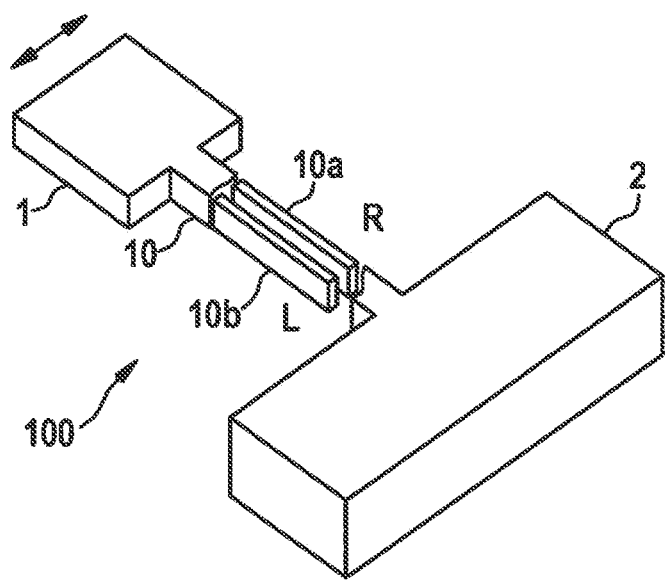
FIG. 2 shows a first specific embodiment of a micromechanical structure according to the present invention.

FIG. 2 shows a perspective view of a micromechanical structure 100 including a mass 1, a deformable, elastic first area 10 in the form of a spring and an armature 2. The spring forms an elastic, vibration-capable system, which may expand or contract mechanically. With the aid of a double arrow above mass 1, FIG. 2 indicates in which directions mass 1 is, for example, movable in order to thus load the spring. Within first area 10, two second areas 10a, 10b are apparent, which are definedly piezoelectrically doped. For an improved understanding, areas 10a, 10b are represented three-dimensionally and exposed; however, in practice they are situated integrally within the spring. Piezoelectrically doped area 10a is indicated by "R", which is intended to suggest that area 10a is situated on the right side of structure 100. Area 10b is additionally indicated by "L", which is intended to suggest that area 10b is situated on the left side of micromechanical structure 100.

Piezoelectrically doped second areas 10a, 10b may be manufactured in such a way that areas 10a, 10b are exposed to, for example, a defined ionic radiation during the manufacture of structure 100. Due to the piezoelectric doping, electrical charges may be generated if the spring in areas 10a, 10b is deformed or vibrated. In the variant of FIG. 2, the two areas 10a, 10b are spatially separated from one another; however, it is also conceivable that, for example, due to tolerances of a manufacturing method, the two areas 10a, 10b are functionally and structurally connected to one another on at least one section, resulting in the implementation of a single piezoelectrically doped area (not shown). This advantageously makes it possible to take process variations into account, so that a functioning structure is also present if the two second areas 10a, 10b are not structurally separated from one another.

Figure 3:
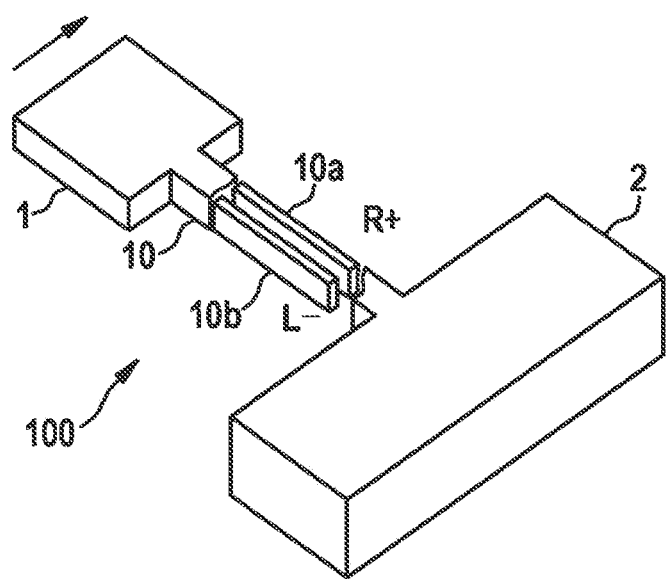
FIGS. 3 and 4 show schematic representations of a generation of an electrical charge with the aid of the micromechanical structure according to the present invention.

FIG. 3 shows a schematic view of a mode of operation of the charge generation in second areas 10a, 10b. It is apparent that in the case of a deflection of mass 1 and consequently of first area 10 to the right, the right side of first area 10 is compressed, and as a consequence, positive electrical charges ("R+") or holes are generated on the right side of first area 10 in area 10a. Similarly, in the case of the above-named movement, the left side of first area 10 or of area 10b is compressed, and as a consequence, negative electrical charges ("L−") or electrons are generated in area 10b on the left side of the spring. Depending on the doping, it would, of course, also be possible that due to the compression of the right side of the spring, negative charges are generated and that due to the compression of the left side of the spring, positive charges are generated.

Figure 4:
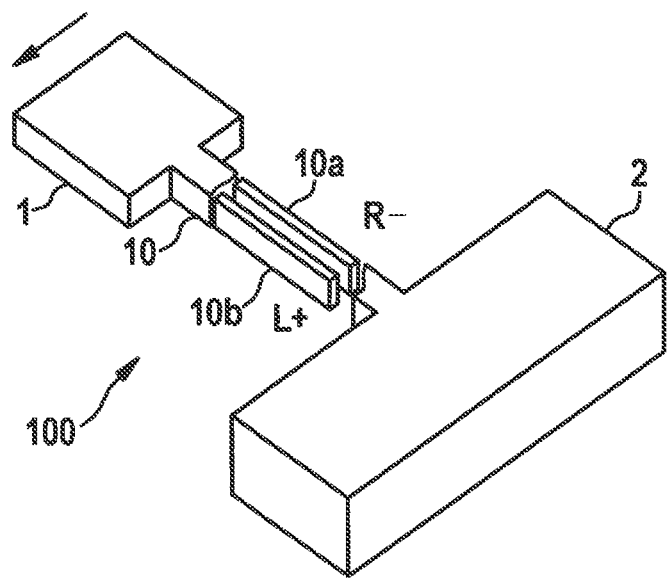

FIG. 4 indicates that a movement of mass 1 or of first area 10 to the left in area 10b causes positive electrical charges ("L+") to be generated on the left side of the spring and negative electrical charges ("R−") on the right side of the spring.

Figure 5:
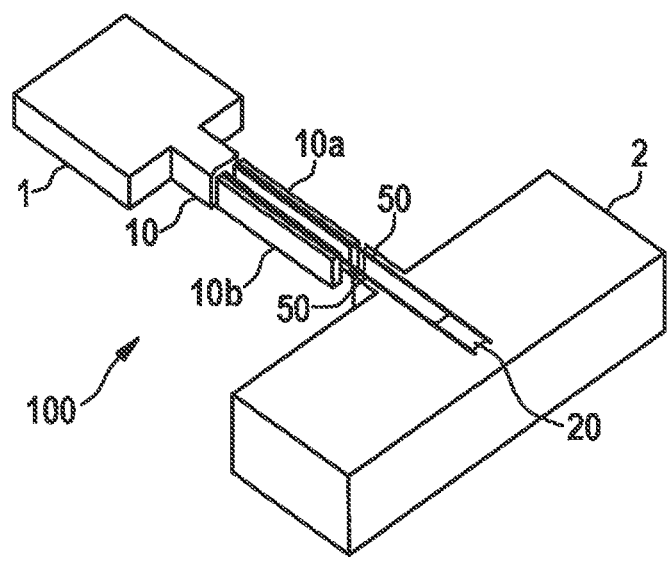
FIGS. 5 through 8 show additional specific embodiments of the micromechanical structure.

FIG. 5 shows schematically that, with the aid of a suitable conductive doping in the insulating base material, a third area 20 may be formed within micromechanical structure 100 including an ohmic resistor having a defined resistance value. Third area 20 thus represents a type of converter which converts the vibration energy of first area 10 into thermal energy. Furthermore, by way of suitable conductive doping within structure 100 electrical strip conductors 50 for transporting the electrical charges or the electrical current may be generated.

The electrical charges generated in second areas 10a, 10b may be supplied to the resistor element of third area 20 via strip conductors 50, the electrical current flowing through resistor 20 being converted into thermal energy. FIG. 5 shows that a constructional design option of the resistor element of third area 20 is to form the resistor in a discrete, spatially narrowly limited manner. Alternatively, it is also possible to allocate a resistor between second areas 10a, 10b, it not being necessary in this case to conduct the electrical charges definedly away from second areas 10a, 10b, as is indicated schematically in FIG. 6.

Figure 6:
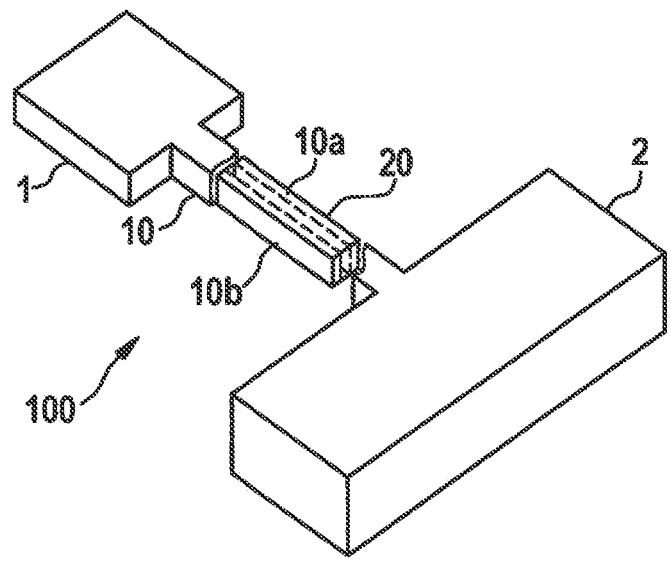

In FIG. 6, it shown that the resistor element of third area 20 may also be situated overlapping piezoelectrically doped second areas 10a, 10b of first area 10.

Alternatively, it is also possible to design third area 20 as an allocated resistor not overlapping piezoelectrically doped second areas 10a, 10b. As a result, this implements a "sandwich-like structure" of piezoelectrically doped areas 10a, 10b and of third area 20 (not shown).

Using the specific embodiments of micromechanical structure 100 of FIGS. 5 and 6, it is possible to damp the vibrations of structure 100 at a constant intensity.

Selective Damping

As described, intended and unintended vibration patterns may occur in the moving or vibrating structure 100. If the pattern of the charge generation is different in the case of intended and unintended vibrations, it is possible to consider these differences in the damping. Using, for example, a suitably designed circuit, it may be possible to retain intended vibrations without interruption, while parasitic vibration patterns are damped.

Figure 7:
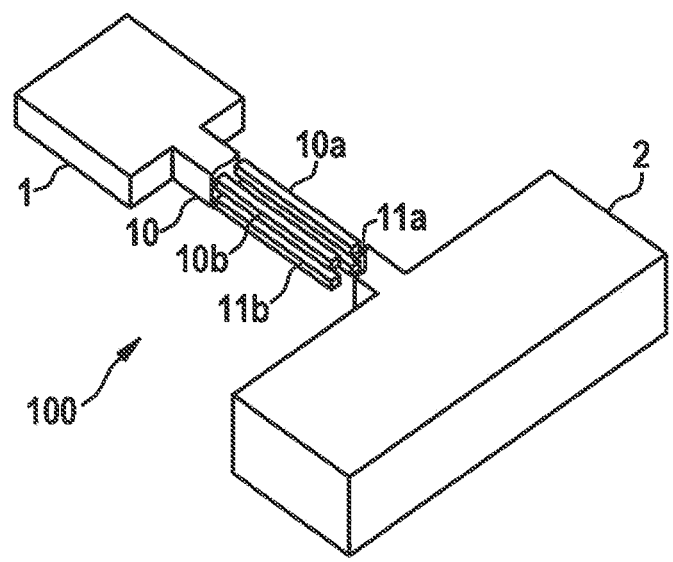

FIG. 7 shows an additional specific embodiment of micromechanical structure 100 designed for this purpose. It is apparent that in addition to upper areas 10a and 10b, additional lower piezoelectrically doped areas 11a and 11b have been formed, which are situated to the left and right within first area 10.

For example, using such a system of second areas 10a, 10b, 11a, 11b, it may be provided that movements of mass 1 and consequently of the spring to the left and right are damped; however, movements of mass 1 and consequently of the spring upward and downward remain essentially undamped.

With the aid of the doped areas of FIG. 7, vibrations of first area 10 in the vertical and horizontal direction may generate electrical charges, which may be accordingly conducted away. For example, it is conceivable that in the case of a movement of mass 1 to the right, right second areas 10a, 11a generate positive charges and left areas 10b, 11b generate negative charges.

In the case of a horizontal vibration of mass 1 or of spring 10, upper second areas 10a, 10b may also generate positive charges and lower second areas 11a, 11b may generate negative charges.

It is thus apparent to those skilled in the art that with the aid of a suitable piezoelectrical doping of the silicon base material of first area 10, it is possible to convert a variety of movement modes of the spring definedly into electrical charges.

In designing such circuits, it may thus be helpful to provide different dopings, those which generate positive charges under a pressure load, and those which generate negative charges under a pressure load. In addition, the resistor elements of third area 20 may in this case also be situated optionally in concentrated or in distributed form.

As a result, this makes it possible to generate an electrical current flow through the different charges, so that using the aforementioned design of resistors or conductors, the undesirable mechanical vibration power may be converted into thermal energy in a defined manner.

Switched Damping

If vibrations are to be damped only above a certain critical amplitude, the option also advantageously exists for designing the damping in a switched embodiment. For this purpose, a definition of an electronic switching threshold is required (for example, with the aid of a control device 40 or a control element in the form of an electronic semiconductor diode). Below the above-named threshold, the electrical charges are not conducted to the resistor of third area 20. This is only the case if the voltage exceeds the defined limit of the switching threshold. In this case, the diode is connected through and it lets through all electrical charges until the voltage changes its sign and the switching threshold is built up again.

Figure 8:
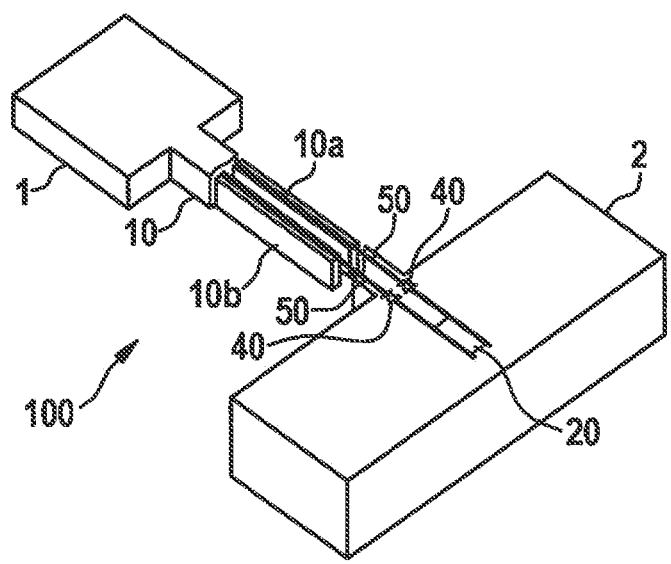

FIG. 8 is intended to indicate such a switched damping including two control devices 40 in the form of diodes, the diodes being formed with the aid of a suitable doping of micromechanical structure 100. For this variant, the resistors of third area 20 are preferably to be designed as concentrated elements.

Regulated Damping

If vibrations of a more complex nature are to be damped or if the setpoint value of the damping is a function of other vibrations or of other parameters, the option exists of designing the switching thresholds to be switchable or controllable with the aid of electronic switches (for example in the form of transistors, microcontrollers, ASICs, etc., which are not shown). This method advantageously also makes it possible to design complex circuits, which implement different damping patterns acting in parallel, either independently or with the aid of, for example, an external control (not shown. This advantageously makes it possible for a sign of charges generated in a second area 10a, 10b to control the damping in various other areas.

According to another variant (not shown in the drawings), third elements of varying size or resistors 20 may also be designed as needed.

It is thus advantageously possible that control device 40, the properties of strip conductors 50 and the resistance value of third areas 20 are a function of at least one of the following variables: temperature, vibration amplitude, vibration phase, vibration rate, size of electromagnetic fields, features of other vibrations of structure 100, control signals of control device 40 ascertained arithmetically, etc.

It is apparent that the concrete implementation forms of the present invention are very diverse, so that the specific embodiments of micromechanical structure 100 as explained above should only be regarded as exemplary.

Figure 9:
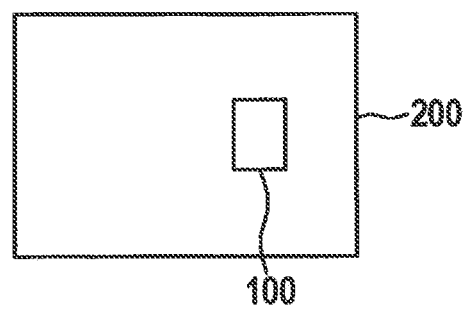
FIG. 9 shows a block diagram of a micromechanical element including the micromechanical structure.

FIG. 9 shows a block diagram of a micromechanical element 200 including a micromechanical structure 100. Micromechanical element 200 may be designed as a micromechanical inertial sensor (for example, an acceleration sensor, rotation rate sensor, pressure sensor, force sensor, etc.).

Figure 10:
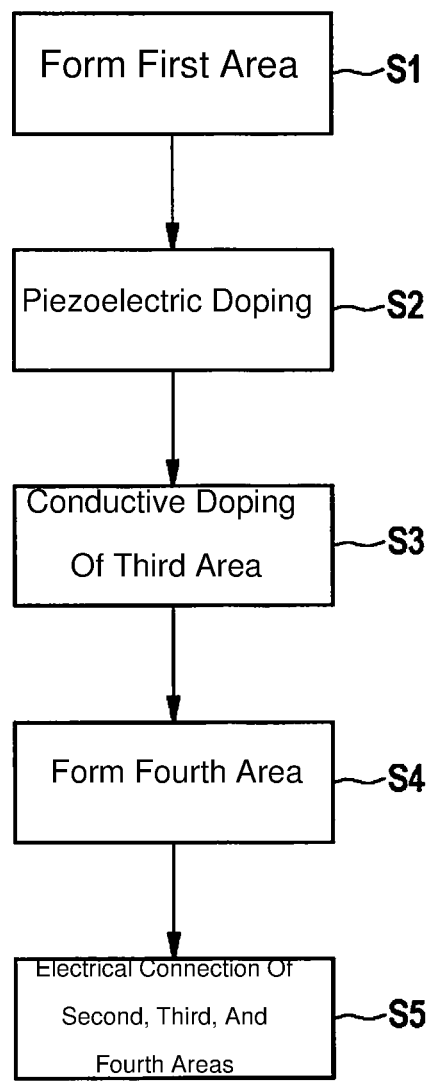
FIG. 10 shows a schematic flow chart of one specific embodiment of the method according to the present invention.

FIG. 10 shows schematically a flow chart of one specific embodiment of the method according to the present invention:

In a first step S1, at least one elastically deformable first area 10 is formed.

In a second step S2, a defined piezoelectric doping of first area 10 is carried out in a second area 10a, at least in sections.

In a third step S3, a conductive doping of at least one third area 20 is carried out.

In a fourth step S4, a fourth area 30 is formed, into which the electrical charges which may be generated in second area 10a may be conducted.

Finally, an electrical connection of second, third and fourth areas 10a, 20, 30 is carried out in a fifth step S5.

It is of course also conceivable to interchange a sequence of above-named steps S1 through S5 with one another arbitrarily.

In summary, the present invention provides a device and a method for definedly converting mechanical vibration energy into electrical energy or thermal energy. With the aid of doped areas of the micromechanical structures, an operation may be generated, which allows unintended vibrations to be damped by converting their mechanical energy into electrical energy, which is subsequently converted into thermal energy and as a result, dissipated. As a result, the mechanical vibration energy is in this way effectively damped or reduced, and substantially fewer harmful effects are able to occur.

Those skilled in the art will implement specific embodiments not described or only partially described above, or combine them with one another, without departing from the core of the present invention.

What is claimed is:

1. A micromechanical structure, comprising:
   at least one elastically deformable first area that includes a defined piezoelectrically doped second area, at least in sections;
   at least one fourth area, into which electrical charges generated in the piezoelectrically doped second area may be conducted; and
   at least one third area connected electrically to the second and fourth areas, and in which an electrical current flowing therethrough is convertible into thermal energy,
   wherein the second, third, and fourth areas are at least partially overlapping.

2. The micromechanical structure as recited in claim 1, wherein the third area is doped conductively using a defined ohmic resistance value.

3. The micromechanical structure as recited in claim 2, wherein a resistance value of the third area is a function of at least one of the following variables: temperature, vibration amplitude, vibration phase, vibration rate, size of an electromagnetic field, and an external control signal.

4. The micromechanical structure as recited in claim 1, wherein the fourth area has a defined capacitance.

5. The micromechanical structure as recited in claim 1, wherein the piezoelectrically doped second area and the fourth area are piezoelectrically doped and are situated at least partially in the elastically deformable first area.

6. The micromechanical structure as recited in claim 1, wherein the piezoelectrically doped second area and the fourth area are piezoelectrically doped and are each situated at least partially in different deformable first areas.

7. The micromechanical structure as recited in claim 1, wherein the second and fourth areas are piezoelectrically doped and positioned in such a way that electrical charges generated by mechanical stresses in the second and fourth areas have opposite signs.

8. The micromechanical structure as recited in claim 1, wherein electrical connections of the second, third, and fourth areas include conductively doped strip conductor structures.

9. The micromechanical structure as recited in claim 8, wherein the conductor structures connecting the third area to at least one of the piezoelectrically doped second area and the fourth area have an electrical conductivity that is a function of at least one of the following variables: temperature, vibration amplitude, vibration phase, vibration rate, a size of an electromagnetic field, and an external control signal.

10. The micromechanical structure as recited in claim 1, further comprising:
    a control device electrically connected to the third area, wherein a switching threshold of the control device is a function of at least one of the following variables: temperature, vibration amplitude, vibration phase, vibration rate, a size of an electromagnetic field, and an external control signal.

11. The micromechanical structure as recited in claim 1, wherein the third area is spatially allocated.

12. A method for manufacturing a micromechanical structure, comprising:
    forming at least one first elastically deformable area;
    performing a piezoelectric doping, at least in sections, of the first elastically deformable area in a second area;
    performing a conductive doping of at least one third area;
    forming a fourth area, into which electrical charges generated in the second area may be conducted; and
    forming an electrical connection of the second, third and fourth area,
    wherein the second, third, and fourth areas are at least partially overlapping.

* * * * *